(12) United States Patent
Lin et al.

(10) Patent No.: US 11,499,869 B2
(45) Date of Patent: Nov. 15, 2022

(54) OPTICAL WALL AND PROCESS SENSOR WITH PLASMA FACING SENSOR

(71) Applicant: Applied Materials, Inc., Santa Clara, CA (US)

(72) Inventors: Chuang-Chia Lin, San Ramon, CA (US); Upendra Ummethala, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 490 days.

(21) Appl. No.: 16/682,616

(22) Filed: Nov. 13, 2019

(65) Prior Publication Data

US 2021/0140824 A1    May 13, 2021

(51) Int. Cl.
| | |
|---|---|
| *G01J 3/443* | (2006.01) |
| *H01J 37/32* | (2006.01) |
| *G01N 21/31* | (2006.01) |
| *H01L 21/66* | (2006.01) |

(52) U.S. Cl.
CPC .............. *G01J 3/443* (2013.01); *G01N 21/31* (2013.01); *H01J 37/32743* (2013.01); *H01L 22/26* (2013.01); *H01J 2237/334* (2013.01)

(58) Field of Classification Search
CPC ........ G01J 3/0208; G01J 3/021; G01J 3/0216; G01J 3/027; G01J 3/443; G01N 21/31; G01N 21/73; H01J 2237/334; H01J 37/32743; H01L 22/26
See application file for complete search history.

(56) References Cited

U.S. PATENT DOCUMENTS

| | | | |
|---|---|---|---|
| 3,594,658 | A | 7/1971 | Cason, III et al. |
| 4,549,080 | A | 10/1985 | Baskins et al. |
| 5,347,460 | A | 9/1994 | Gifford et al. |
| 5,985,032 | A | 11/1999 | Eriguchi |
| 9,970,818 | B2 | 5/2018 | Bao et al. |
| 10,134,569 | B1 | 11/2018 | Albarede et al. |
| 10,319,649 | B2 | 6/2019 | Cho et al. |

(Continued)

FOREIGN PATENT DOCUMENTS

| | | |
|---|---|---|
| JP | 2018026558 | 2/2018 |
| KR | 10-2006-0002177 | 1/2006 |

(Continued)

OTHER PUBLICATIONS

International Search Report and Written Opinion of the International Searching Authority for PCT/US2020/054970; dated Jan. 29, 2021, pp. 10.

(Continued)

*Primary Examiner* — Hina F Ayub
(74) *Attorney, Agent, or Firm* — Schwabe, Williamson & Wyatt, P.C.

(57) ABSTRACT

Embodiments disclosed herein include an optical sensor system for use in plasma processing tools. In an embodiment, the optical sensor system, comprises an optically clear body with a first surface and a second surface facing away from the first surface. In an embodiment, the optically clear body further comprises a third surface that is recessed from the second surface. In an embodiment, the optical sensor system further comprises a target over the third surface and a first reflector to optically couple the first surface to the target.

5 Claims, 6 Drawing Sheets

(56) References Cited

U.S. PATENT DOCUMENTS

| | | | |
|---|---|---|---|
| 2004/0237888 A1 | 12/2004 | Codella et al. | |
| 2008/0074658 A1 | 3/2008 | Davis et al. | |
| 2008/0278721 A1 | 11/2008 | Bai et al. | |
| 2010/0110423 A1 | 5/2010 | Villaumie | |
| 2015/0126874 A1 | 5/2015 | Lee et al. | |
| 2015/0131698 A1 | 5/2015 | Vellore et al. | |
| 2017/0153214 A1* | 6/2017 | Wang | G01N 33/0013 |
| 2017/0322133 A1 | 11/2017 | Trainer | |
| 2017/0322149 A1* | 11/2017 | Pape | G01N 21/31 |
| 2018/0012737 A1 | 1/2018 | Moon | |
| 2019/0101375 A1 | 4/2019 | Morino et al. | |

FOREIGN PATENT DOCUMENTS

| | | |
|---|---|---|
| KR | 10-2012-0039253 | 4/2012 |
| KR | 102025873 | 9/2019 |

OTHER PUBLICATIONS

Final Office Action from U.S. Appl. No. 16/378,271 dated Apr. 6, 2021, 15 pgs.
International Search Report and Written Opinion from PCT/US2020/026476 dated Jul. 23, 2020, 12 pgs.
Non-final Office Action from U.S. Appl. No. 16/378,271 dated Jul. 30, 2020, 18 pgs.
Non-final Office Action from U.S. Appl. No. 16/378,271 dated Feb. 16, 2021, 12 pgs.
International Preliminary Report on Patentablility from Application No. PCT/US2020/054970 dated May 27, 2022) 7 pgs.

* cited by examiner

OPTICAL WALL AND PROCESS SENSOR WITH PLASMA FACING SENSOR

BACKGROUND

1) Field

Embodiments relate to the field of semiconductor manufacturing and, in particular, to systems and methods for providing in-situ optical sensors for monitoring chamber surface conditions and chamber processing parameters.

2) Description of Related Art

Changes to the surfaces of a chamber impact various processing parameters. For example, redeposition of etching byproducts on the chamber wall may alter the etching rate of a given process. Accordingly, as substrates are processed in the chamber, the etching rate (or other process parameters) may change and result in non-uniform processing between substrates.

In an attempt to account for changes to processing conditions, optical emission spectroscopy (OES) has been implemented in processing chambers. OES involves monitoring the emission spectrum of a plasma in the chamber. A window is positioned along the chamber wall and the emission spectrum may pass along an optical path through the window to a sensor outside of the chamber. As the spectrum of a plasma changes, qualitative analysis of the processing operation may be inferred. Particularly, OES is useful for determining when an end-point of the processing operation has been met. In order to provide the best measurements, the window is designed to prevent deposition from occurring along the light path. Furthermore, while end-point analysis is possible, there is currently no process for implementing quantitative analysis using existing OES systems.

SUMMARY

Embodiments disclosed herein include an optical sensor system for use in plasma processing tools. In an embodiment, the optical sensor system, comprises an optically clear body with a first surface and a second surface facing away from the first surface. In an embodiment, the optically clear body further comprises a third surface that is recessed from the second surface. In an embodiment, the optical sensor system further comprises a target over the third surface and a first reflector to optically couple the first surface to the target.

Embodiments disclosed herein may also comprise an optical sensor. In an embodiment, the optical sensor comprises an optically clear body. In an embodiment, the optically clear body comprises a first surface, a second surface opposite from the first surface, and a third surface recessed into the second surface. In an embodiment, the optical sensor further comprises a target over the third surface, a first reflector embedded in the optically clear body, and a second reflector embedded in the optically clear body. In an embodiment, the optical sensor further comprises a light source optically coupled to the optically clear body, and an optical detector optically coupled to the optically clear body.

Embodiments disclosed herein may also comprise a plasma processing chamber. In an embodiment, the plasma processing chamber comprises an optical sensing system passing through a wall of the plasma processing chamber. The optical sensing system comprises, a lens and an optically clear body adjacent to the lens. In an embodiment, the optically clear body comprises, a first surface that faces the lens, a second surface opposite from the first surface, and a third surface recessed into the second surface, wherein the third surface faces a center of the processing chamber. In an embodiment, the optical sensing system further comprises a target over the third surface, and a first reflector embedded in the optically clear body.

DETAILED DESCRIPTION

Figure 1:
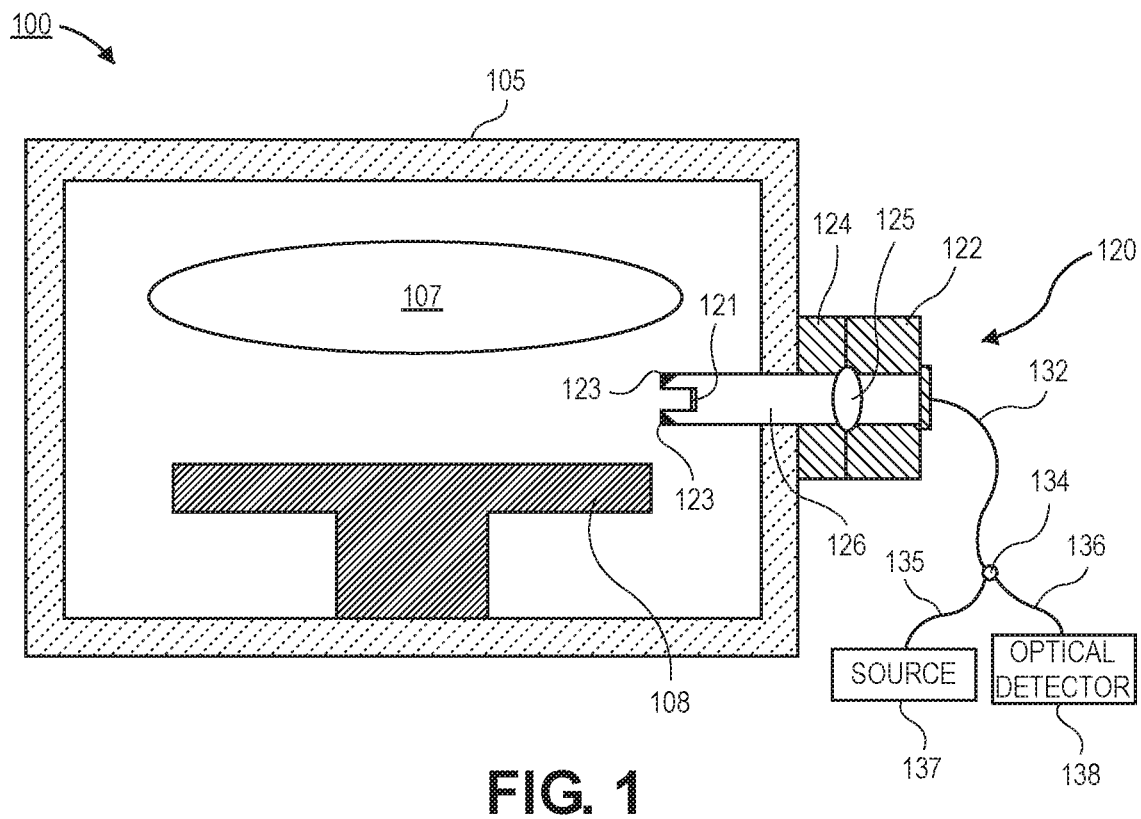
FIG. 1 is a cross-sectional illustration of a processing tool with an optical sensor system, in accordance with an embodiment.

Systems and methods described herein include optical sensors for in-situ monitoring of a chamber condition and/or processing conditions in the chamber. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, currently available optical emission spectroscopy (OES) systems can provide qualitative measurements to achieve functions such as end-point determinations, but cannot currently provide precise quantitative measurements. Processing parameters, such as etch rate, cannot be directly measured with existing OES systems. Accordingly, embodiments disclosed herein include an optical sensor system that measures a reference signal and the plasma emission spectrum. For example, the reference signal begins at a light source, passes through the chamber wall, and reflects off of a target surface in the chamber and back towards a sensor. Since the reference signal and the emission spectrum pass within the same optical sensor system, the reference signal can be used to determine the losses attributable to the optical path without opening the chamber and disrupting the operation. This allows for an accurate and quantitative measurement of the emission spectrum. Accordingly, the calibrated plasma emission spectrum can be used to determine processing parameters, such as etch rate.

Furthermore, whereas currently available OES systems are designed to prevent deposition along the optical path, embodiments disclosed herein include a target that is exposed to the processing environment. In some embodiments, the target may be chosen to substantially match the interior surfaces of the chamber. Additionally, the target may be oriented to face the plasma. This ensures that the target experiences substantially the same environmental conditions as the chamber surface. As such, deposition on the target is substantially similar to the deposition seen on the interior surface of the chamber. The target interacts with the photons emitted by the source, and therefore, can be used to determine characteristics of the deposited film or conversions of the wall materials. For example, absorption of portions of the spectrum of the photons may be correlated to a particular material composition and/or thickness of the film.

Accordingly, embodiments disclosed herein allow for quantitative in-situ measurement of processing conditions, substrate conditions, and/or chamber conditions. Since quantitative measurements are provided by embodiments disclosed herein, embodiments may allow for chamber matching measurements (i.e., comparison of a single process that is implemented in different chambers). In some embodiments, a single optical sensor may be included in the processing chamber. Other embodiments may include an array of optical sensors positioned around a perimeter of the processing chamber. Such embodiments may allow for chamber uniformity data (e.g., plasma uniformity, chamber surface uniformity, substrate uniformity etc.) to be obtained. Furthermore, such embodiments may also provide an indication of chamber abnormality (e.g., chamber drift).

Referring now to FIG. 1, a cross-sectional illustration of a processing tool 100 is shown, in accordance with an embodiment. In an embodiment, the processing tool 100 comprises a chamber 105. For example, the chamber 105 may be suitable for low pressure processing operations. In one embodiment, the processing operations may include the generation of a plasma 107 in the chamber 105. In an embodiment, a substrate support 108 is in the chamber 105. The substrate support 108 may be a chuck (e.g., an electrostatic chuck, a vacuum chuck, or the like) or any other suitable support on which one or more substrates may be placed during processing.

In an embodiment, the processing tool 100 may comprise an in-situ optical sensor 120. The in-situ optical sensor 120 passes through a surface of the chamber 105 so that a first portion of the optical sensor 120 is inside the chamber 105 and a second portion of the optical sensor is outside the chamber 105. In an embodiment, the optical sensor 120 is illustrated as passing through a sidewall of the chamber 105. However, it is to be appreciated that the optical sensor 120 may be positioned through any surface of the chamber 105.

In the illustrated embodiment, a single optical sensor 120 is shown. However, it is to be appreciated that embodiments are not limited to such configurations, and more than one optical sensor 120 may be included in the processing tool 100. Furthermore, the optical sensor 120 only requires a single optical opening (i.e., a window) through the chamber 105. As will be described in greater detail below, the optical path includes a target 121 that is along an optical path that reflects the photons from a source 137 back through the same opening. For example, one or more reflectors 123 may be included along the optical path. This is in contrast to existing systems that require an optical path across the volume of the chamber 105 and requires at least two optical openings through the chamber.

In an embodiment, the target 121 is oriented so that it faces an interior of the chamber 105. Orienting the target 121 so that the target 121 faces the interior of the chamber 105 allows for the surface of the target 121 to be modified in substantially the same manner that interior surfaces of the chamber are modified during the processing operation. For example, the byproducts deposited onto interior surfaces of the chamber 105 may also be deposited onto the target 121. Furthermore, such an orientation of the target 121 will expose the target to substantially the same ion and/or electron bombardment as the interior surfaces of the chamber 105. Accordingly, the chemical reactions on the target 121 are substantially similar to those on the interior surface of the chamber 105. In a particular embodiment, the target 121 may comprise the same material as the interior surfaces of the chamber 105. Accordingly, changes to the surface of the target 121 may be assumed to substantially match changes to the interior surface of the chamber 105. In this manner, chamber surface monitoring may be implemented by the optical sensor 120.

In an additional embodiment, the target 121 may comprise a grating. A grating can be fabricated so that it provides a known wavelength dependent angle of diffraction of the incident light. As the grating is altered (e.g., by deposition, material removal, or material conversion), changes to the target can be detected as a change in the intensity received at the optical detector, and may serve as an additional mechanism for monitoring the chamber condition.

In an embodiment, the optical sensor 120 comprises a housing. In an embodiment, the housing may comprise a first housing 124 and a second housing 122. In an embodiment, the first housing 124 may be fastened to the second housing 122 with any suitable fastener. In other embodiments, the housing may be a single structure. That is, the first housing 124 and the second housing 122 may be combined into a single structure. Furthermore, while a first housing 124 and a second housing 122 are disclosed, it is to be appreciated that the housing may comprise any number of components coupled together.

In an embodiment, the first housing 124 may secure an optically clear body 126 that passes through the chamber 105 into an interior of the chamber 105. In an embodiment, the optically clear body 126 may be quartz, sapphire, or the like. The optically clear body 126 allows for photons from the plasma 107 to enter the optical sensor 120. Additionally, light from the source 137 may propagate through the optically clear body 126 and reflect off of one or more of the reflectors 123 and the target 121.

In some embodiments, a lens 125 is secured between the first housing 124 and the second housing 122. The lens 125 is positioned along an optical path between the source 137 and the target 121 in order to focus photons that pass along the optical path. In some embodiments, the lens 125 may be part of the seal that closes the opening through the chamber 105. For example, O-rings or the like (not shown) may rest against a surface of the lens 125 facing towards the chamber 105.

In an embodiment, the optical sensor 120 may further comprise a source 137 and an optical detector 138. The source 137 and the optical detector 138 may be optically coupled to the optical path. For example, a fiber optic cable 132 may extend out from the second housing 122. In an embodiment, the fiber optic cable 132 may comprise a splitter 134 that branches off to a fiber optic cable 135 to the source 137 and a fiber optic cable 136 to the optical detector 138.

In an embodiment, the source 137 may be any suitable source for propagating photons along the optical path. Particularly, embodiments include a high precision source 137. A high precision source 137 provides a known electromagnetic spectrum or specific wavelength and intensity that can be used as a reference baseline for calibrating measurements with the optical sensor 120. In one embodiment, the source 137 may be a single wavelength source. For example, the source 137 may be a laser or a light emitting diode (LED). In other embodiments, the source 137 may be a broadband light source. For example, the source 137 may be an arc flash lamp (e.g., a xenon flash lamp).

In an embodiment, the optical detector 138 may be any suitable sensor for detecting photons. In an embodiment, the optical detector 138 may comprise a spectrometer. For example, the spectrometer may have a charge-coupled device (CCD) array. In other embodiments, the optical detector 138 may have a photodiode that is sensitive to a particular wavelength of photons.

Figure 2A:
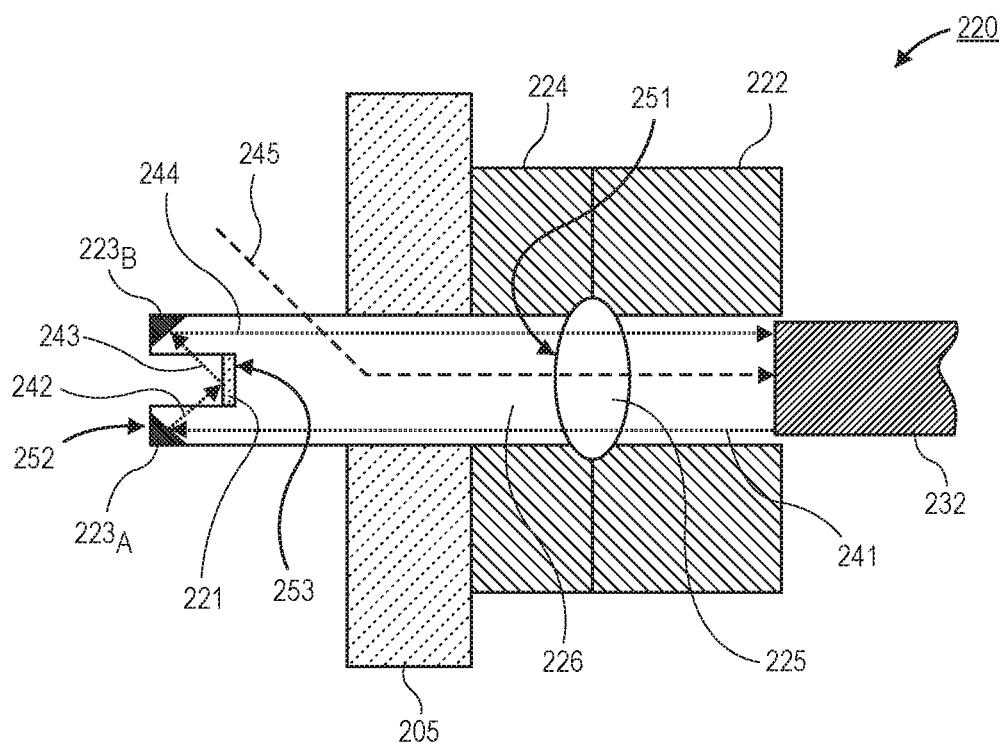
FIG. 2A is a cross-sectional illustration of an optical sensor system with a recessed target and reflectors, in accordance with an embodiment.

Referring now to FIG. 2A, a cross-sectional illustration of an optical sensor 220 is shown, in accordance with an embodiment. In an embodiment, the optical sensor 220 comprises a first housing 224 and a second housing 222. The first housing 224 may secure an optically clear body 226 that passes through the chamber wall 205. In an embodiment, the optically clear body 226 comprises a first surface 251 and a second surface 252 that is opposite from the first surface 251. In an embodiment, a third surface 253 of the optically clear body 226 is recessed from the second surface 252.

In an embodiment, a target 221 is disposed over the third surface 253. In some embodiments, the target 221 may comprise the same material as the interior surface of the chamber 205. In an embodiment, the target 221 is exposed to the interior of the processing chamber.

In an embodiment, a first reflector $223_A$ and a second reflector $223_B$ are embedded in the optically clear body 226. Embedding the reflectors $223_A$ and $223_B$ in the optically clear body 226 prevents the environment within the chamber from altering the reflectors $223_A$ and $223_B$. The first reflector $223_A$ and the second reflector $223_B$ may be positioned between the second surface 252 and the third surface 253. In the particular embodiment illustrated in FIG. 2A, the first reflector $223_A$ and the second reflector $223_B$ are located at the corners of the optically clear body 226. In an embodiment, the reflectors $223_A$ and $223_B$ may be any suitable reflector. For example, the reflectors $223_A$ and $223_B$ may be mirror like surfaces, gratings, or any other structure suitable for altering the path of light.

In an embodiment, an optical path may pass through the optical sensor 220. The optical path is represented in FIG. 2A with a plurality of ray traces 241-244. The optical path starts with ray 241 from the optical cable 232 to the first reflector $223_A$. The optical path continues with ray 242 reflecting off of the first reflector $223_A$ to the target 221. That is, the first reflector $223_A$ may be referred to as being optically coupled to the target 221. In an embodiment, the optical path continues with ray 243 reflecting off of the target 221 to the second reflector $223_B$. That is, the second reflector $223_B$ may be referred to as being optically coupled to the target 221. In an embodiment, the optical path continues with ray 244 reflecting off of the second reflector $223_B$ to the optical cable 232.

As shown in FIG. 2A, the rays 242 and 243 may propagate through portions of the optically clear body 226 and through portions of the interior of the chamber 205. That is, ray 242 starts within the optically clear body 226 and exits optically clear body 226 (through a sidewall) before reaching the target 221. Similarly, the ray 243 starts outside of the optically clear body 226 and enters the optically clear body 226 (through a sidewall) before reaching the second reflector $223_B$. Accordingly, the target 221 may be external to the optically clear body 226. This allows for the target 221 to be exposed to substantially the same environmental conditions as the interior surface of the chamber 205.

In an embodiment, photons 245 from the processing environment inside the chamber 205 may enter into the optically clear body 226 through a sidewall of the optically clear body 226. In an embodiment, the photons 245 pass through the optically clear body 226 and enters the optical cable 232. The illustration of the photons 245 is shown as bending without contacting any reflective surface. However, this is for illustration only, and it is to be appreciated that the photons 245 may reflect off of any number of surfaces before reaching the optical cable 232.

In an embodiment, the optical sensor 220 may further comprise a lens 225. In an embodiment, the lens may be used to focus photons (e.g., ray 241, ray 244, or ray 245) that pass through the optical sensor 220. In an embodiment, the optical sensor 220 may be adjacent to the first surface 251 of the optically clear body 226. As shown, the first surface 251 conforms to the shape of the lens 225. In other embodiments, the first surface 251 may be a substantially planar surface.

Figure 2B:
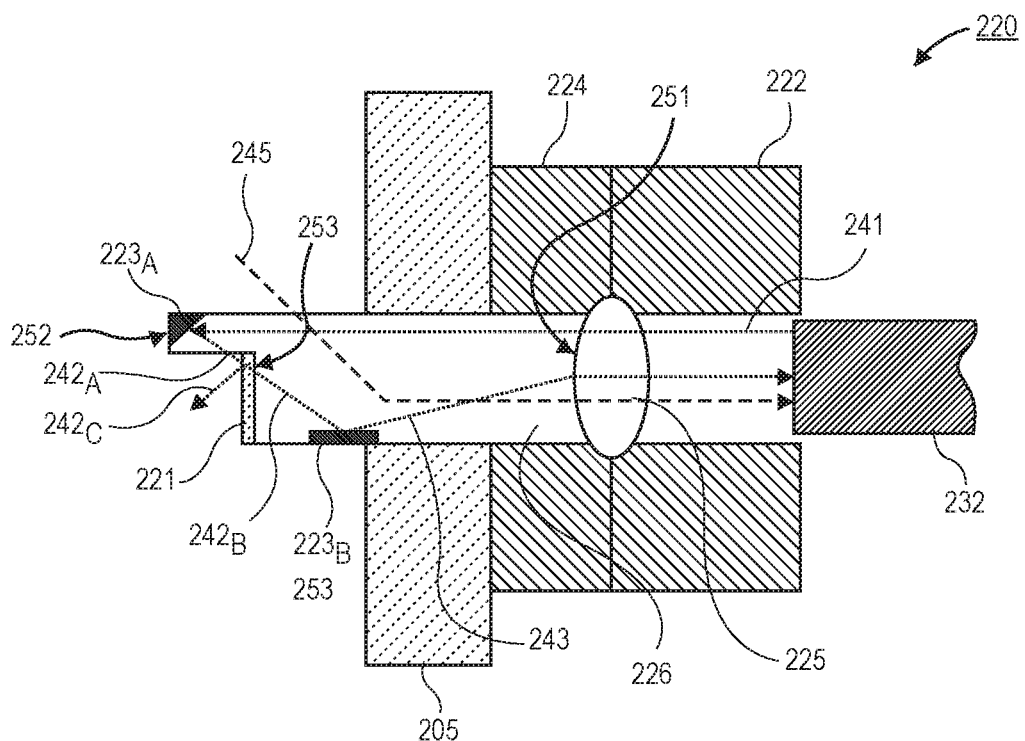
FIG. 2B is a cross-sectional illustration of an optical sensor system with a recessed target where the optical path passes through the target, in accordance with an embodiment.

Referring now to FIG. 2B, a cross-sectional illustration of an optical sensor 220 is shown, in accordance with an additional embodiment. In an embodiment, the optical sensor 220 in FIG. 2B may be similar to the optical sensor 220 in FIG. 2A with the exception of the positioning of the reflectors $223_A$ and $223_B$. Furthermore, the recessed third surface 253 may have a different configuration than the recessed third surface 253 in FIG. 2A.

As shown, the recessed third surface 253 results in only a single protrusions of the optically clear body 226 extending past the target 221. In an embodiment, the first reflector $223_A$ may be positioned in the protrusion of the optically clear body 226. That is, the first reflector $223_A$ may be positioned between the second surface 252 and the third surface 253. In an embodiment, the second reflector $223_B$ may be positioned between the third surface 253 and the first surface 251.

The change to the locations of the second reflector $223_B$ results in a different optical path through the optically clear body 226. As shown, the first ray 241 passes through the optically clear body 226 and intersects the first reflector $223_A$. The reflected second ray $242_A$ then passes outside the optically clear body 226 and intersects the target 221. In an embodiment, the optical path continues through the target 221. That is, a portion of the second ray $242_A$ passes through the target 221 back into the optically clear body 226 (i.e., third ray $242_B$). The third ray $242_B$ intersects the second reflector $223_B$. A portion of the second ray $242_A$ may reflect off of the target 221 (i.e., fourth ray 242c). In an embodiment, the optical path then continues with a fifth ray 243 that continues to the optical cable 232.

Such an optical path differs from the optical path in FIG. 2A in that the optical path passes through the target 221. Accordingly, as the target 221 changes (e.g. due to the deposition of materials, etching of materials, or the like) the intensity of the ray 242$_B$ and/or the wavelengths of the ray 242$_B$ changes.

Figure 2C:
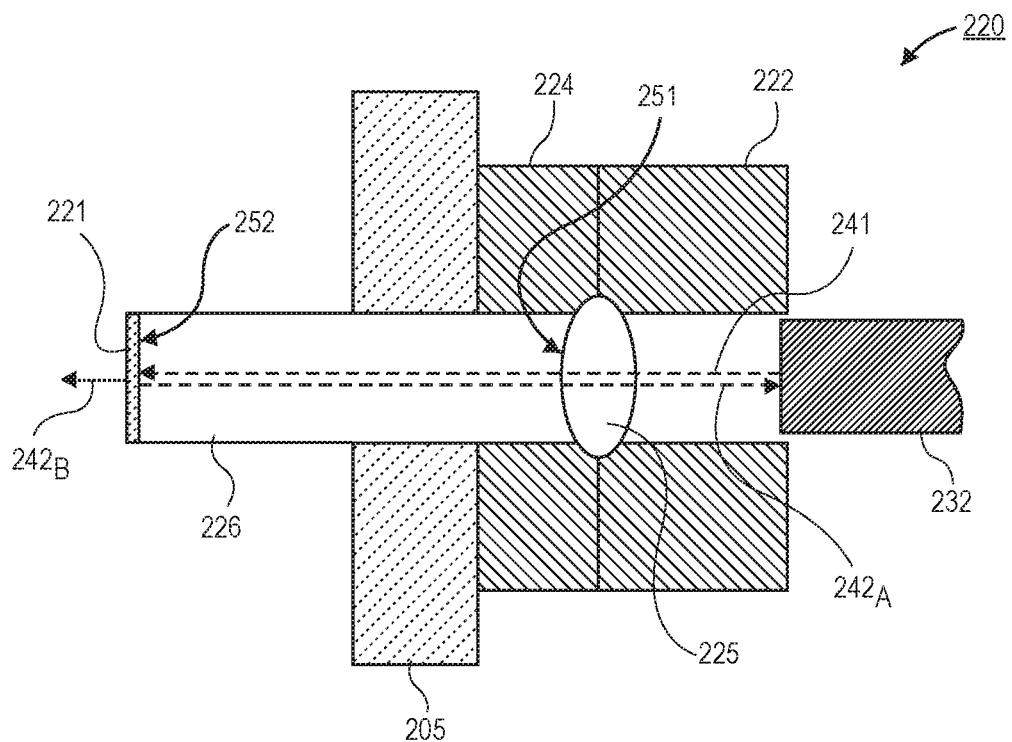
FIG. 2C is a cross-sectional illustration of an optical sensor system with a target where the optical path reflects off a backside surface of the target, in accordance with an embodiment.

Referring now to FIG. 2C, a cross-sectional illustration of an optical sensor 220 is shown, in accordance with an additional embodiment. In FIG. 2C, the target 221 is positioned over the second surface 252. That is, there is no recessed third surface in some embodiments. In such an embodiment, the optical path remains within the optically clear body 226. For example, a first ray 241 passes through the optically clear body 226 and intersects with a backside surface of the target 221. A portion (i.e., ray 242$_B$) passes through the target 221, and a portion (i.e., ray 242$_A$) reflects back to the optical cable 232. Similar to the embodiment in FIG. 2B, as the target 221 changes (e.g. due to the deposition of materials, etching of materials, or the like) the intensity of the ray 242$_A$ and/or the wavelengths of the ray 242$_A$ changes. However, the embodiment in FIG. 2C differs from that in FIG. 2B in that the light of interest in FIG. 2B is the light that passes through the target 221, whereas the light of interest in FIG. 2C is the light that is reflected off of the target 221.

Figure 2D:
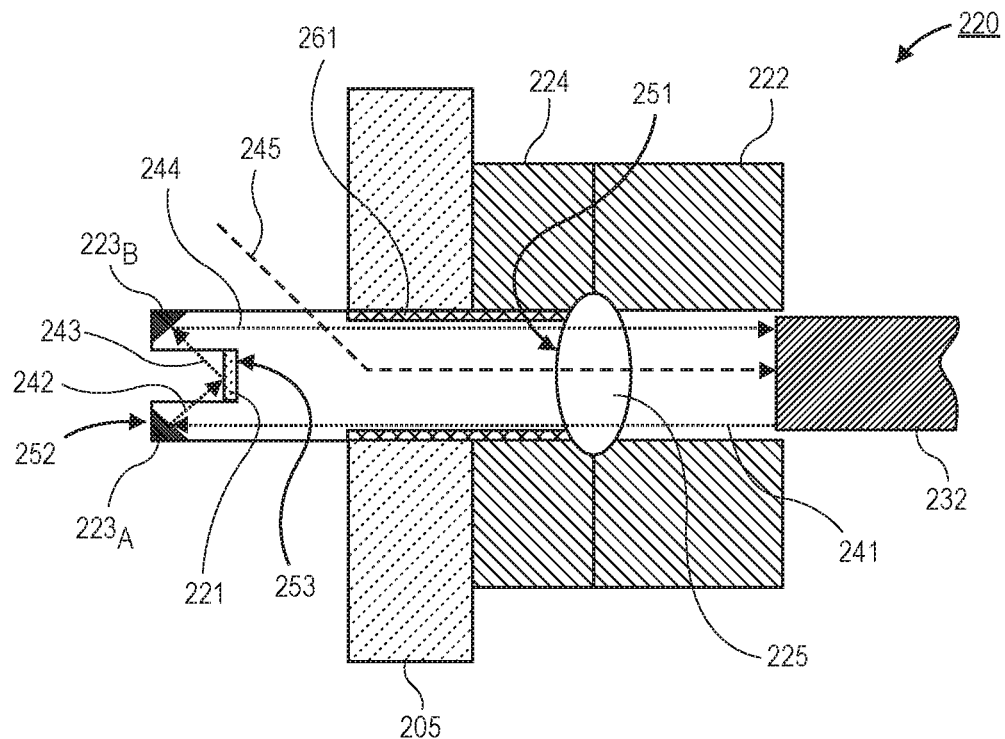
FIG. 2D is a cross-sectional illustration of an optical sensor system with an optically clear body that includes a reflective coating, in accordance with an embodiment.

Referring now to FIG. 2D, a cross-sectional illustration of an optical sensor 220 is shown, in accordance with an additional embodiment. In an embodiment, the optical sensor 220 in FIG. 2D is substantially similar to the optical sensor 220 in FIG. 2A, with the exception that an additional reflector is included. Particularly, the embodiment illustrated in FIG. 2D further comprises a reflector 261 that encircles a perimeter of a portion of the optically clear body 226. For example, the reflector 261 may cover the surfaces of the optically clear body 226 that are within the chamber opening and surrounded by the housing 224. Such a reflector may increase the amount of light from ray 245 that is extracted from the processing environment.

Figure 2E:
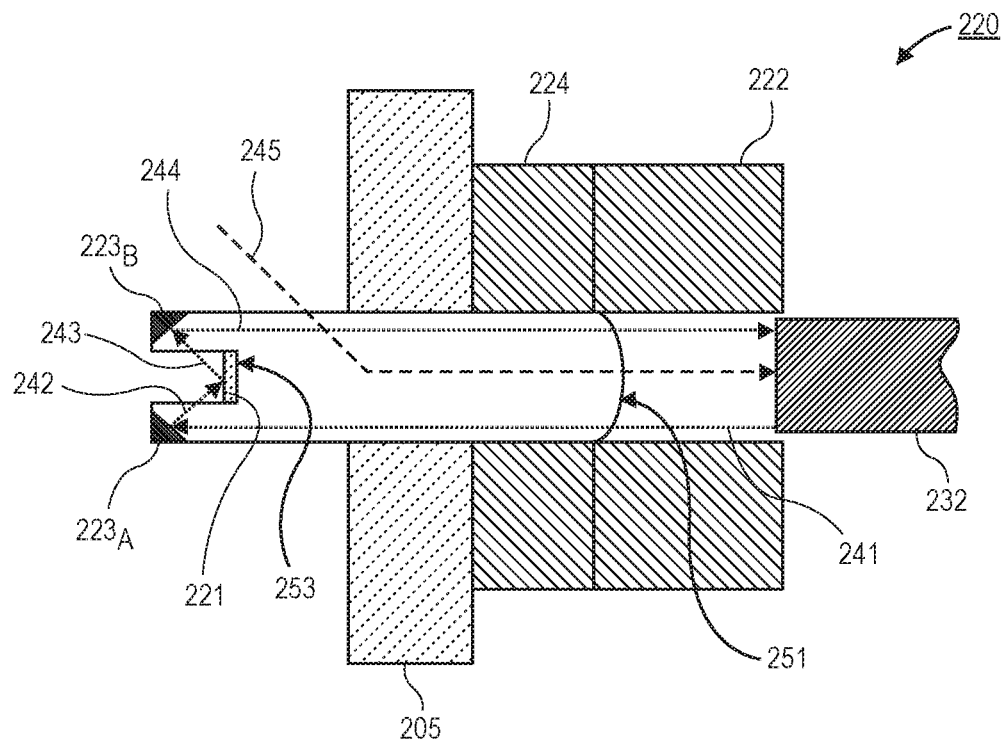
FIG. 2E is a cross-sectional illustration of an optical sensor system with an optically clear body that comprises a lens surface, in accordance with an embodiment.

Referring now to FIG. 2E, a cross-sectional illustration of an optical sensor 220 is shown, in accordance with an additional embodiment. The optical sensor 220 in FIG. 2E is substantially similar to the optical sensor 220 in FIG. 2A, with the exception that the discrete lens 225 is removed. That is, embodiments, disclosed herein may include an optical sensor 220 that does not include a focusing lens. In other embodiments (as shown in FIG. 2E), the optically clear body 226 may include a first surface 251 that is shaped to provide a lens. Accordingly, the optically clear body 226 may have an integrated lens.

Figure 3:
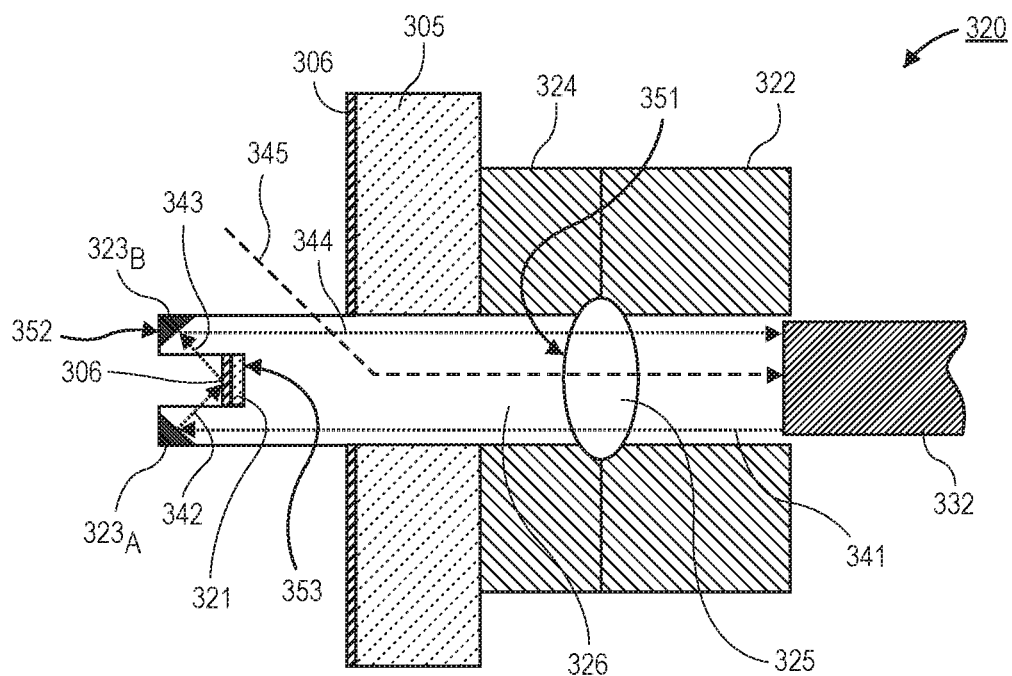
FIG. 3 is a cross-sectional illustration of an optical sensor system with a coating over the target, in accordance with an embodiment.

Referring now to FIG. 3, a cross-sectional illustration depicting the use of an optical sensor 320 is shown, in accordance with an embodiment. In an embodiment, the optical sensor 320 may be substantially similar to any of the optical sensors 220 described above. In a particular embodiment, the optical sensor 320 is substantially similar to the optical sensor 220 illustrated in FIG. 2A. That is, the optical sensor 320 may comprise a first housing 324, a second housing 322, a lens 325, and an optically clear body 326. The optical sensor 320 may be inserted through a hole in a chamber 305.

In an embodiment, the optically clear body 326 may comprise a first surface 351, a second surface 352, and a recessed third surface 353. In an embodiment, a first reflector 323$_A$ and a second reflector 323$_B$ may be positioned between the third surface 353 and the second surface 352. In an embodiment, a target 321 may be disposed over the third surface 353. The target 321 may comprise substantially the same material as an interior surface of the chamber 305.

In an embodiment, a film 306 may be disposed over surfaces of the chamber 305 and over the surface of the target 321. The film 306 may be a byproduct of a processing operation implemented in the chamber 305. For example, the film 306 may be a redeposition of byproducts of an etching process. In an embodiment where the surface of the target 321 is the same material as the interior surface of the chamber 305, the film 306 on the target 321 will be representative of the film 306 on the interior surface of the chamber 305. Particularly, since the target 321 faces the interior of the chamber 305, the target 321 will be subject to the substantially the same processing environment as the chamber surfaces (e.g., substantially the same ion and/or electron bombardment as the interior surfaces of the chamber 305).

In an embodiment, an optical measurement of the film 306 may be made using the sensor 320. For example, light from a source (not shown) may be propagated along an optical path that intersects with the film 306 over the target 321 before reaching an optical detector (not shown). The light source and the optical detector may be optically coupled to the optical sensor 320 by an optical cable 332. In an embodiment, rays 341-344 depict an optical path that is substantially similar to the optical path described above with respect to FIG. 2A.

Since the source emits photons with a known spectrum and intensity, a measurement of the ray 344 by the optical detector before deposition of the film 306 provides a baseline of the losses along the optical path. Such a measurement may be referred to herein as a reference signal measurement. Accordingly, the difference between the measurement of the ray 344 (e.g., spectrum and intensity) to the known spectrum and intensity of the source provides a measure of the losses inherent to the optical sensor 320. Accordingly, the known losses may be used to calibrate subsequently obtained signals.

The optical sensor 320 may be used to determine one or more properties of the film 306. In an embodiment, the reflected ray 344 may be measured to find differences relative to the reference signal measurement. For example, after the film 306 is deposited, decreases in particular wavelengths of the reflected ray 344 (relative to the reference signal measurement) may be used to determine what materials comprise the film 306. Particularly, certain materials will preferentially absorb portions of the spectrum of the reference signal. Accordingly, identifying the portions of the reflected ray 344 that are reduced in intensity allows for the composition of the film 306 to be determined. Additionally, changes to the reflected ray 344 subsequent to the deposition of film 306 may also identify film thicknesses.

Additionally, photons emitted by a plasma may be sensed by the sensor. For example, the plasma signal 345 may pass through a sidewall of the optically clear body 326 and propagate along the optical path to the optical detector (not show). The measurement of the plasma signal 345 may then be corrected by adding back in the known losses inherent to the optical sensor 320. As such, a quantitative measurement of the photons emitted by the plasma may be provided.

Figure 4A:
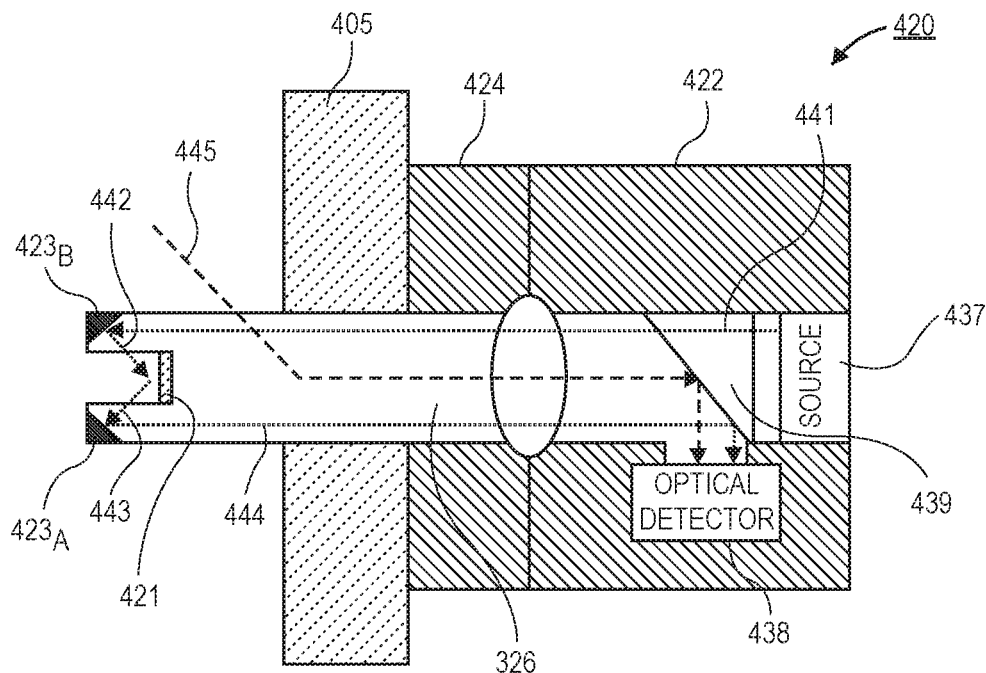
FIG. 4A is a cross-sectional illustration of an optical sensor system with a prism for reflecting light to an optical detector, in accordance with an embodiment.

Referring now to FIG. 4A, a cross-sectional illustration of an optical sensor 420 is shown, in accordance with an additional embodiment. The optical sensor 420 in FIG. 4A is substantially similar to the optical sensor 220 in FIG. 2A, with the exception that the source 437 and the optical detector 438 are integrated directly into the second housing 422. For example, the ray 441 may pass through the prism 439 and the lens 425 towards the reflectors $423_A$ and $423_B$ and the target 421, and the reflected ray 444 and the plasma signal 445 may be redirected by the prism 439 towards the optical detector 438. Accordingly optical coupling of the optical source 437 and the optical detector 438 to the optical path may be implemented without fiber optic cables. Such embodiments may also provide a more compact optical sensor 420.

Figure 4B:
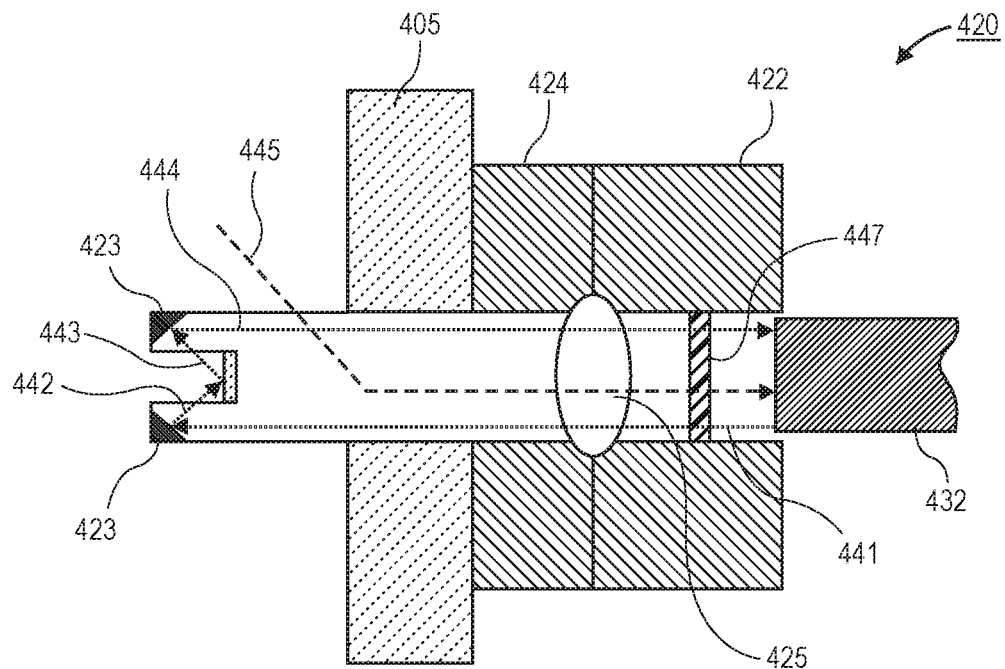
FIG. 4B is a cross-sectional illustration of an optical sensor system with a filter, in accordance with an embodiment.

Referring now to FIG. 4B, a cross-sectional illustration of an optical sensor 420 is shown, in accordance with an additional embodiment. The optical sensor 420 in FIG. 4B is substantially similar to the optical sensor 220 in FIG. 2A, with the exception that a filter 447 is positioned along the optical path. In an embodiment, the filter 447 may provide a specific pass band in order to improve signal to noise ratios, and improve performance of the optical sensor. In an embodiment, the filter 447 is positioned between the lens 425 and the sensor (not shown). That is the filter 447 is positioned outside of the chamber volume in order to be protected from the processing environment.

Figure 5:
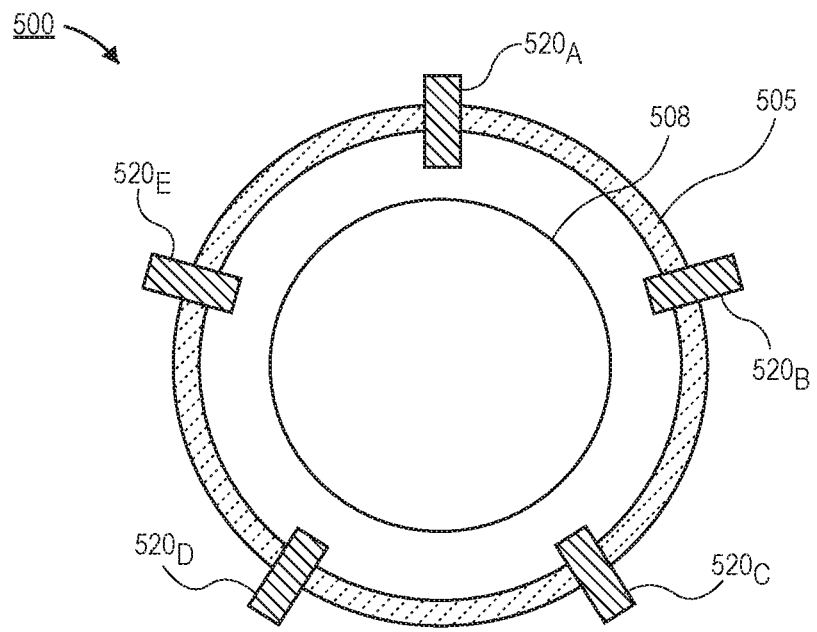
FIG. 5 is a cross-sectional plan view of a chamber with an array of optical sensor systems, in accordance with an embodiment.

Referring now to FIG. 5, a plan view cross-sectional illustration of a processing tool 500 is shown, in accordance with an embodiment. In an embodiment, the processing tool 500 may comprise a chamber 505. A substrate support 508 (e.g., a chuck or the like) may be located within the chamber 505. In an embodiment, a plurality of optical sensors $520_{A-E}$ are arranged in an array around the perimeter of the chamber 505. The optical sensors $520_{A-E}$ may be substantially similar to one or more of the optical sensors described above. In the illustrated embodiment five optical sensors $520_{A-E}$ are shown. However, it is to be appreciated that any number of optical sensors 520 may be included in the processing tool 500. The use of a plurality of optical sensors 520 allows for obtaining uniformity data. For example, plasma uniformity and/or wall condition uniformity may be obtained. Additionally, chamber drift may also be determined.

Figure 6:
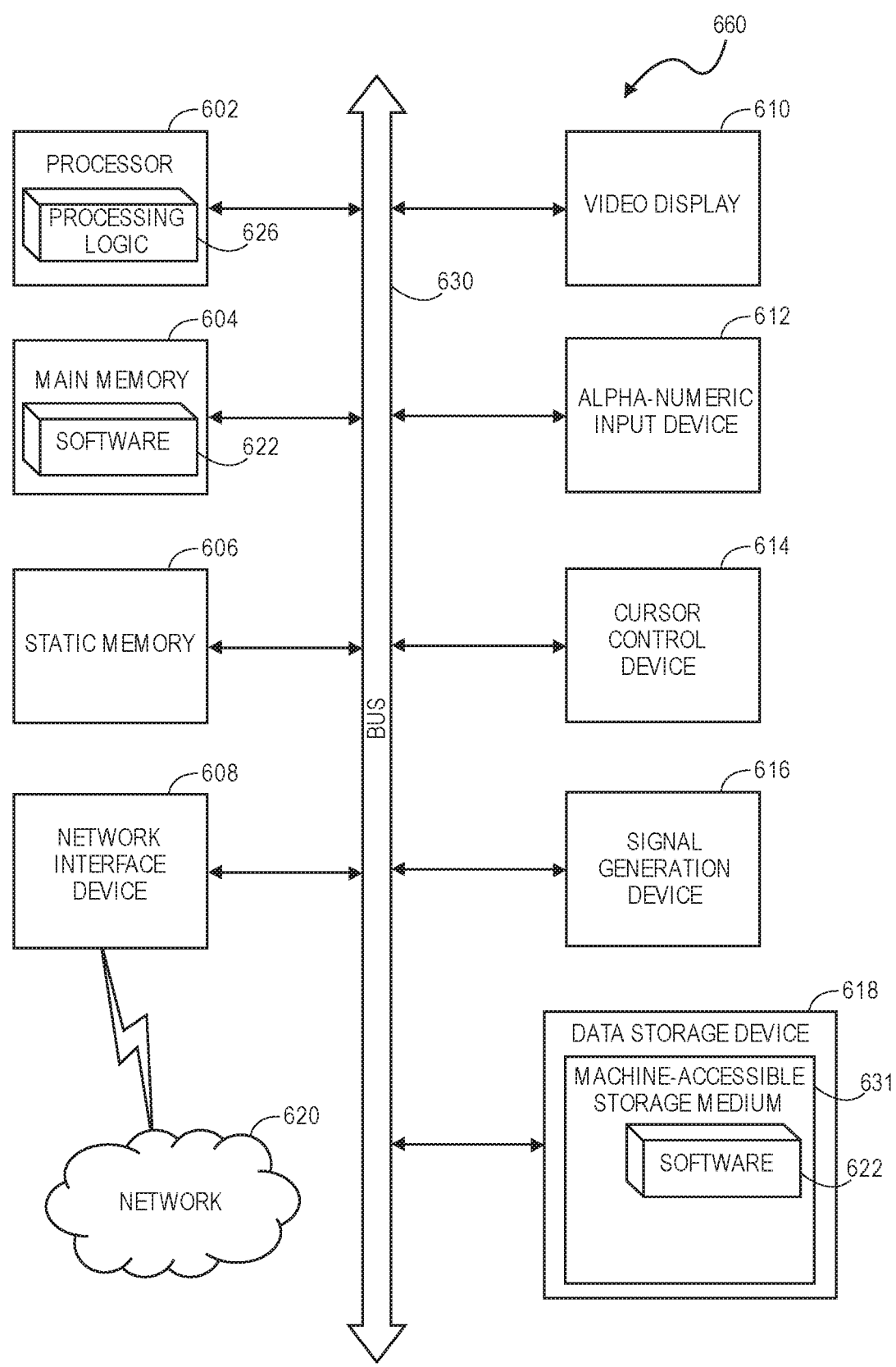
FIG. 6 illustrates a block diagram of an exemplary computer system that may be used in conjunction with an optical sensor with an optical path that passes through a chamber wall, in accordance with an embodiment.

Referring now to FIG. 6, a block diagram of an exemplary computer system 660 of a processing tool is illustrated in accordance with an embodiment. In an embodiment, computer system 660 is coupled to and controls processing in the processing tool. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608. In an embodiment, the network interface device 608 may operate using RF coupling, optical coupling, acoustic coupling, or inductive coupling.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A plasma processing chamber, comprising:
   an optical sensing system passing through a wall of the plasma processing chamber, wherein the optical sensing system comprises:
      a lens;
      an optically clear body adjacent to the lens, wherein the optically clear body comprises:
         a first surface that faces the lens;
         a second surface opposite from the first surface; and
         a third surface recessed into the second surface, wherein the third surface faces a center of the processing chamber;
      a target over the third surface; and
      a first reflector embedded in the optically clear body.

2. The plasma processing chamber of claim 1, wherein the optical sensing system is configured to provide a plasma condition, a wall condition, a substrate condition, or any combination thereof.

3. The plasma processing chamber of claim 1, further comprising a plurality of optical sensing systems.

4. The plasma processing chamber of claim 1, further comprising:
   a light source optically coupled to the optically clear body; and
   an optical detector optically coupled to the optically clear body.

5. The plasma processing chamber of claim 1, wherein the target is outside of the optically clear body and within the plasma processing chamber.

* * * * *